United States Patent [19] [11] 4,057,347
Moriyama et al. [45] Nov. 8, 1977

[54] OPTICAL EXPOSURE APPARATUS

[75] Inventors: Shigeo Moriyama, Kokubunji; Tatsuo Harada, Fuchu; Yoshio Kawamura, Kokubunji; Seiya Hashimoto, Tokyo, all of Japan; Akihiro Takanashi, Gainesville, Fla.; Toshiei Kurosaki, Shinji Kuniyoshi, Sumio Hosaka, all of Kokubunji, Japan

[73] Assignee: Hitachi, Ltd., Japan

[21] Appl. No.: 670,830

[22] Filed: Mar. 26, 1976

[30] Foreign Application Priority Data
  Mar. 26, 1975  Japan .................. 50-35581

[51] Int. Cl.² ............... G01B 11/26; G03B 27/54
[52] U.S. Cl. ........................ 355/67; 356/172; 250/491
[58] Field of Search ........... 355/53, 54, 67, 75; 356/172, 110; 250/491

[56] References Cited
U.S. PATENT DOCUMENTS 3,207,904  9/1965  Heinz .................. 356/172 X
3,704,946  12/1972  Brault et al. .......... 355/53 X
3,843,916  10/1974  Trotel et al. .......... 356/106 X Primary Examiner—L. T. Hix
Assistant Examiner—M. L. Gellner
Attorney, Agent, or Firm—Craig & Antonelli

[57] ABSTRACT

An improved optical exposure apparatus for use in exposing a workpiece to a desired light pattern with a high alignment accuracy and a high operational speed is disclosed. The apparatus comprises a moving table on which a workpiece to be exposed is disposed, a movable holder on which a mask having an original pattern is disposed, a light source for irradiating said mask, a reduction lens for projecting a reduced pattern of said original pattern onto said workpiece, means for positioning said moving table to a predetermined position, means for detecting the error of said table positioning, means for calculating a value of the error of positioning the workpiece divided by the reduction rate of the reduction lens, and means for automatically shifting said movable holder by the calculated value so as to cancel said error.

5 Claims, 4 Drawing Figures

OPTICAL EXPOSURE APPARATUS

BACKGROUND OF THE INVENTION

1. Field of the Invention

This invention relates to an optical exposure apparatus for projecting a reduced pattern of an original mask pattern precisely onto a desired position of a workpiece to be exposed, and more particularly to an improvement of an alignment system of such an apparatus for precise alignment of the original mask pattern and the workpiece.

2. Description of the Prior Art

Semiconductor devices, such as transistors or integrated circuits, are usually fabricated by a series of diffusion steps. Each diffusion step involves applying a coat of photosensitive polymer, known as photo-resist, over a silicon dioxide layer on the surface of the semiconductor substrate. Then, the photo-resist is exposed to light through a mask having a predetermined pattern by means of an optical exposure apparatus. When the photo-resist is photographically developed, selected areas of the photo-resist are removed to expose the underlying silicon dioxide. The exposed silicon dioxide is then removed by an etching fluid which does not attack the photo-resist to expose the underlying semiconductor material. The photo-resist is then stripped from the silicon dioxide and impurities are diffused into the areas of the semiconductor material exposed by the openings in the silicon dioxide layer. A new silicon dioxide layer is either grown over the exposed portion of the semiconductor material during the diffusion process, or is subsequently deposited, and the above-mentioned steps are repeated as often as required for the formation of the desired circuitry.

As the above-mentioned optical exposure apparatus, a so called "step and repeat camera" is usually used. A schematic block diagram of the step and repeat camera of the conventional type is shown in FIG. 1.

Referring now to FIG. 1, the camera is principally composed of a light source 6, a condenser lens 7, a mask 1, a reduction lens 8, a moving table 4, and a table position control circuit 3. In actuality, the moving table 4 can be moved in the X and Y directions, but, for simplification, the table movement in the Y direction is not shown in FIG. 1.

In operating the camera, firstly, the mask 1, which has an original pattern 1a formed by an opaque material, is set on a stationary holder H.. And, a semiconductor wafer 2 is placed on the table 4. Then, the table position is adjusted so that the desired exposure position of the semiconductor wafer 2 is precisely located at the projection position of the reduced pattern of the original pattern. That is, the table position control circuit 3 controls the table position in response to a control signal S1 supplied from a control signal generator 9, so that a proper alignment is obtained. When this operation for controlling the table position has been finished, a signal S2 is delivered to an exposure control circuit 5, and then the light source 6 begins to operate in response to an exposure control signal S3 supplied from the circuit 5.

A dispersed light beam $l_1$ from the light source 6 is formed into a parallel light beam $l_2$ by the condenser lens 7, and then the mask 1 is irradiated by this parrallel light beam. A light beam $l_3$ passing through the mask 1 is projected on the wafer 2 through the reduction lens 8, so that the photo-resist layer disposed on the wafer 2 is exposed by the reduced pattern of the original pattern.

In the above-mentioned conventional optical exposure apparatus, the accuracy of the alignment of the exposure position and projection position is decided approximately according to the accuracy of positioning the table 4. Therefore, in order to increase the accuracy of the fabrication of the semiconductor devices, it is necessary to provide a X-Y moving table having a very high accuracy. As a result, the moving table becomes very expensive and heavy in weight. Additionally, the moving speed of the table is restricted to small a value because of its heavy weight. In a result, the time period required for one time of exposure becomes long, and hence the efficiency of the fabrication decreses. Furthermore, it is impossible to ignore the decrease of the accuracy of the table positioning under the influence of the changes of the circumferential conditions, such as temperature, during the exposure step.

SUMMARY OF THE INVENTION

The primary object of this invention is to provide an improved optical exposure apparatus in which the abovementioned disadvantages of the conventional apparatus are eliminated.

In particular, it is an object of this invention to provide an optical exposure apparatus which is able to increase the accuracy of the alignment of the exposure position and the projection position.

A further object of this invention is to provide an optical exposure apparatus which is able to shorten the time period required for the alignment.

In order to accomplish these objects, the optical exposure apparatus according to this invention is characterized in that an automatic control means for adjusting the mask position so as to cancel the error of the table positioning is further provided.

More specifically, the optical exposure apparatus according to this invention comprises essentially a light source, a mask having an original pattern, a reduction lens, a moving table on which a workpiece to be exposed is placed, control means for positioning the table at a predetermined position, means for detecting the error of the table positioning, and means for automatically controlling the mask position so as to cancel the error of the table positioning.

By such an arrangement, the accuracy of the alignment is remarkably improved by reason that the influence on the accuracy of the alignment due to the error of the mask positioning is reduced by the reduction lens. Additionally, the accuracy required for the positioning of the table and the mask is not so high, and hence the positioning devices can be simplified in its construction, and lightened in its weight, so that, the operation for alignment can be speededup.

Other objects and features of this invention will become more apparent from the following detailed description taken in conjunction with the accompanying drawings.

DESCRIPTION OF THE PREFERRED EMBODIMENTS

Figure 2:
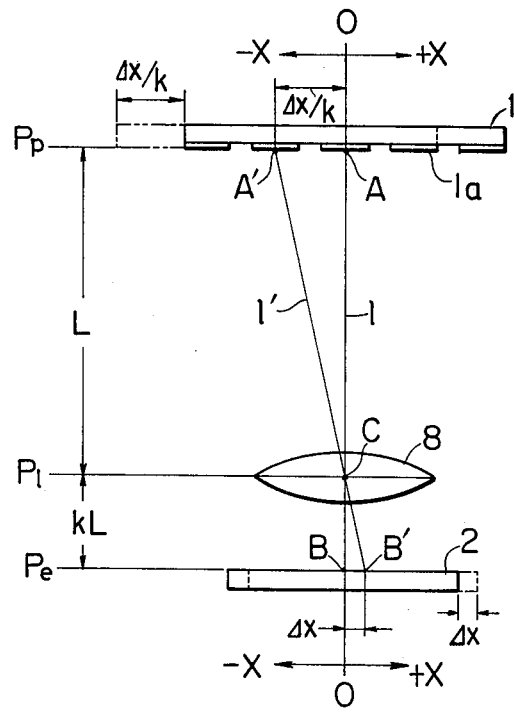
FIG. 2 is a diagram illustrating the principle of this invention.

Firstly, the principle of this invention will be explained briefly referring to FIG. 2.

In this Figure, only a mask 1, a reduction lens 8 and a workpiece 2 are selectively illustrated.

The mask 1 is disposed on a plane $P_p$ being perpendicular to the optical axis 1. The focal plane $P_e$ of the lens 8 is perpendicular to the optical axis 1. The mask 1 has an original pattern 1a formed by an opaque material disposed on the lower surface thereof. The workpiece 2 has a photo-resist layer on the upper surface thereof. The upper surface of the workpiece 2 is located on the focal plane $P_e$ of the lens 8. When the mask 1 is irradiated by the parallel light, beam a reduced pattern of the original pattern is projected on the workpiece 2. The reduction ratio of the lens 8 is designated by $k(k < 1)$. The size of the projected pattern becomes smaller than that of the original pattern.

When the mask 1 and the workpiece 2 are properly aligned, the desired point A on the original pattern 1a is projected onto the desired point B of the upper surface of the workpiece 2. But, if the workpiece 2 is shifted by the positioning error $\Delta x$ in the $+X$ direction and hence the point B is shifted to the point B', the desired point A is not projected onto the desired point B'. In this case, if the mask 1 is shifted by the $\Delta x/k$ in the $-X$ direction and hence the point A is shifted to the point A', the desired point A' is pojected again onto the desired point B'.

From the above explanation, it is quite understandable that the mis-alignment due to the positioning error of the workpiece can be corrected by the adjustment of the mask position according to the positioning error.

This invention is accomplished in accordance with the above-mentioned principle. That is, according to this invention, the positioning error of the workpiece is detected, and the mask position is automatically adjusted in response to the detected signal so as to cancel the positioning error.

Figure 3:
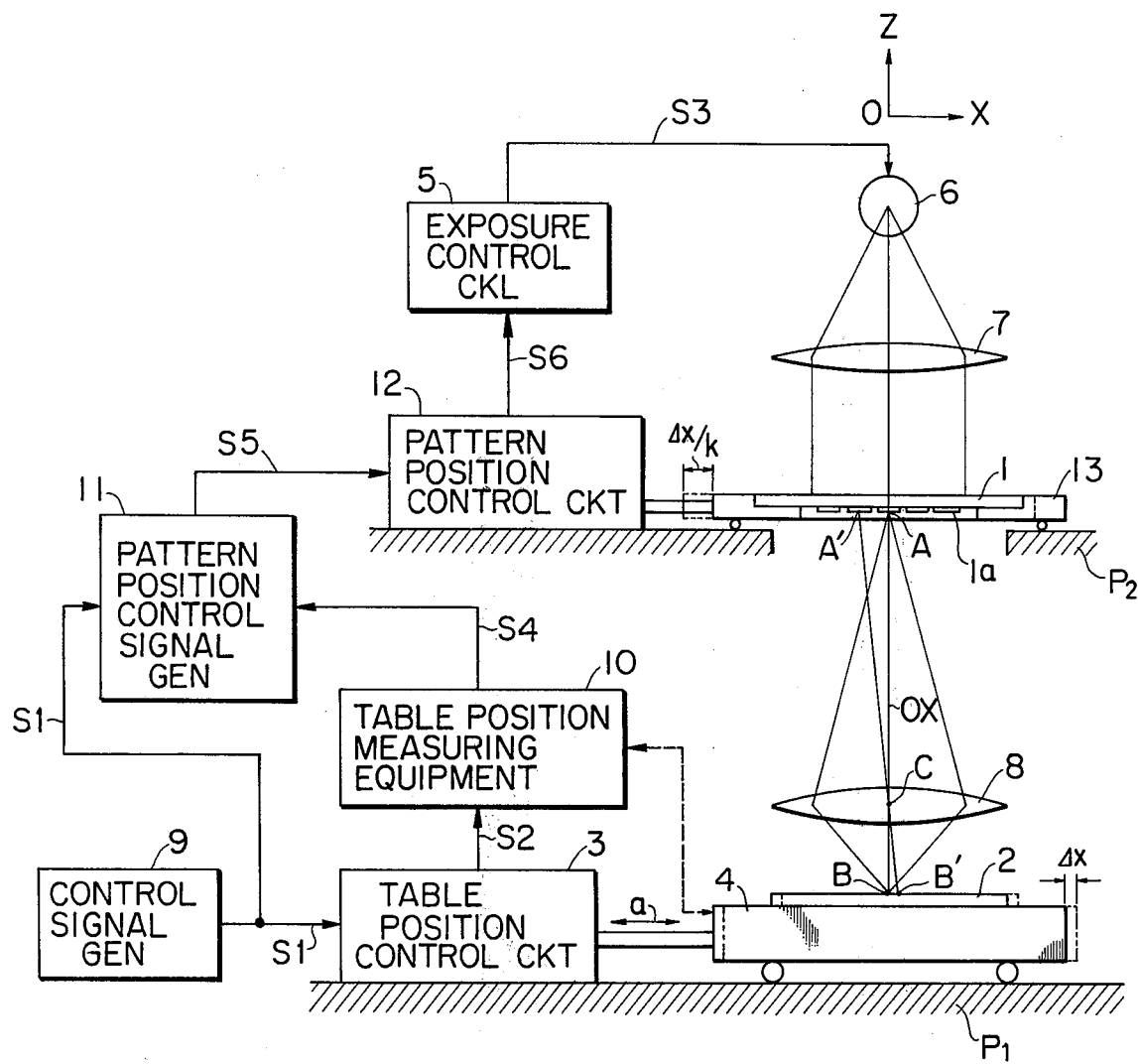
FIG. 3 is a schematic diagram of an optical exposure apparatus embodying this invention.

FIG. 3 shows a schematic diagram of an optical exposure apparatus embodying this invention. In this embodiment, the optical exposure apparatus comprises a movable holder 13. The holder 13 carries a mask 1 having an original pattern 1a. The position of the holder 13 is adjusted by a control circuit 12 in response to a control signal S5.

A workpiece 2 is supported on the moving table 4. The position of the table 4 is adjusted by a control circuit 3 in response to a control signal S1.

A control signal generator 9 generates the control signal S1 corresponding to the moving distance of the table 4 which is required for the alignment of the mask 1 with the workpiece 2.

When the control signal S1 is applied to the table position control circuit 3, the control circuit 3 establishes the position of the table 4 by shifting the table 4 by the amount of the distance corresponding to the control signal S1. A signal S2 is generated from the control circuit 3 when the position of the table 4 is completely established.

A table position measuring equipment 10 detects table positions before and after the establishment of the table position, and a signal S4 corresponding to the difference between the table positions before and after the establishment of the table position, i.e. the actual moved distance of the table 4 is generated therefrom.

When the signals S1 and S4 are applied to a pattern position control signal generator 11, in the signal generator 11, the difference between the required moving distance and the actual moved distance of the table 4, i.e. a positioning error $\Delta x$ and a value of $\Delta x/k$ ($k$: a reduction ratio of the lens 8) are calculated, and a signal S5 corresponding to the value of $\Delta x/k$ is generated from the signal generator 11.

A pattern position control circuit 12 moves the holder 13 by a value of $-\Delta x/k$, when the signal S5 is applied thereto, and the position of the mask 1 is established. A signal S6 is generated at when the mask position is established.

When the signal S6 is applied to an exposure control circuit 5, the control circuit 5 transmits a control signal S3 for a predetermined amount of exposure to the light source 6.

According to the above arrangement, even when the workpiece 2 is not established precisely at a predetermined position, and hence there is an error $\Delta x$ between the required moving distance and the actual moved distance of the table 4, the alignment of the mask 1 with the workpiece 2 is precisely carried out, since the mask 1 is automatically moved by $-\Delta x/k$ and thereby cancelling the error.

Though an error is also caused when the position of the mask 1 is established, this error does not become a big problem, since the alignment error due to this error is reduced to a sufficiently small value according to the reduction ratio of the lens 8. Therefore, it is possible to utilize mechanisms having a relatively low precision for establishing the positions of the mask 1 and the table 4.

Consequently, according to the present invention, an optical exposure apparatus being very cheap whose time period for establishing the position is very short can be provided, since mechanisms for establishing the position can be made so as to have simple structures and light weight.

Figure 4:
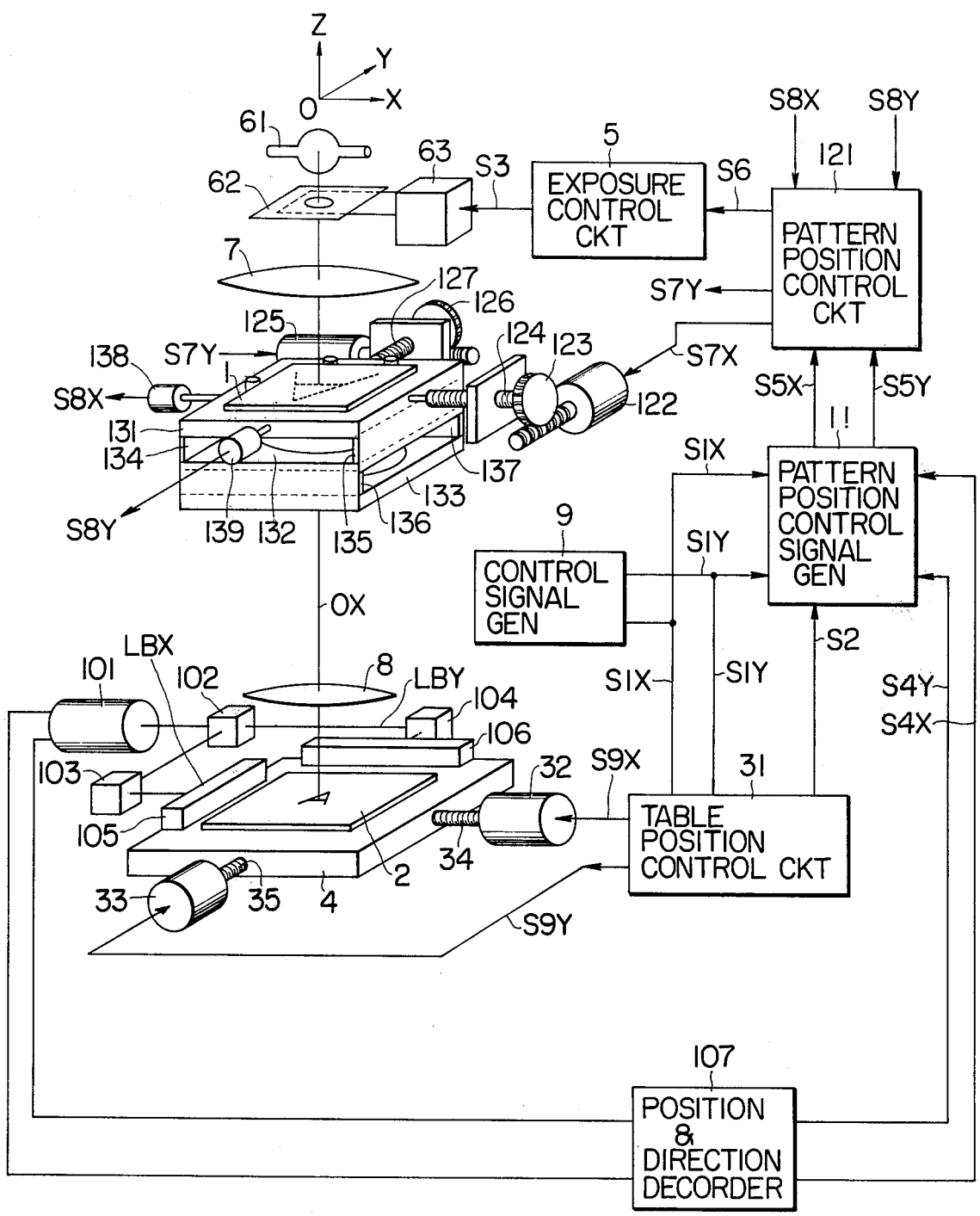
FIG. 4 is a trimetric projection view of an optical exposure apparatus embodying this invention.

FIG. 4 is a trimetric view of an optical exposure apparatus according to another embodiment of the present invention.

In this embodiment, a mask 1 having an original pattern is placed and fixed at a predetermined portion on a holder 131 by holding means utilizing therein a vacuum suction. This holder 131 is attached to a disk 132 through a pair of leaf springs 134 and 135 parallel to each other, and the disk 132 is attached to a fixed base 133 through a pair of leaf springs 136 and 137 parallel to each other. Therefore, the holder 131 can be moved toward the X and Y directions respectively within a range of $\pm$ 100 $\mu$m without a rotation thereof.

Movement of the holder 131 toward the X direction is achieved by a pulse motor 122 through a worm gear 123 and a feed screw 124, and movement of the holder 131 toward the Y direction is achieved by a pulse motor 125 through a worm gear 126 and a feed screw 127.

Differential transformers 138 and 139 for measuring the position of the holder 131 are adjoined to side surfaces of the holder 131 in the X and Y directions, respectively.

Workpiece 2 is placed and fixed at a predetermined portion on a moving table 4 by holding means utilizing therein the vacuum suction. This table 4 is moved toward the X and Y directions by pulse motors 32 and 33, and feed screws 34 and 35, respectively.

A laser interferometer 101 is utilized for detecting the amount of the actual movement of the table 4. The amounts of the movement of the table 4 toward the X and Y directions are measured by utilizing laser beams LBX and LBY which are obtained by dividing a laser beam generated from a laser included in the interferometer 101 by a beam splitter 102 as distances between interferometers 103 and 104 and reflectors 105 and 106 disposed on the table 4 as shown in FIG. 4, respectively.

A control signal generator 9 generates control signals S1X and S1Y which correspond to moving distances toward the X and Y directions, respectively, of the table 4, which are required for the alignment of the mask 1 with the workpiece 2.

A table position control circuit 31 receives the control signals S1X and S1Y, and transmits driving signals S9X and S9Y to the pulse motors 32 and 33, respectively. These driving signals S9X and S9Y have many pulses whose numbers correspond to required moving distances of the table 4 toward the X and Y directions, respectively. Therefore, the pulse motors 32 and 33 rotate corresponding to numbers of pulses of the driving signals S9X and S9Y, respectively, and the position of the table 4 is settled. When the establishment of the table position is completed, a signal S2 is generated from the table position control circuit 31.

A position and direction decoder 107 receives output signals S10X and S10Y from the laser interferometer 101, calculates actually moved distances of the table 4 on the basis of said output signals S10X and S10Y, and generates output signals S4X and S4Y according to the results of the calculation.

A pattern position control signal generator 11 calculates the differences between the required moving distance of the table 4 given by the signals S1X and S1Y and the actually moved distance of the table 4 given by the signals S4X and S4Y, i.e. positioning errors $\Delta x$ and $\Delta y$, and values of $\Delta x/k$ and $\Delta y/k$ ($k$: a reduction rate of the lens 8), and generates control signals S5X and S5Y.

A pattern position control circuit 121 receives these control signals S5X and S5Y and generates driving signals S7X and S7Y which are transmitted to the pulse motors 122 and 125, respectively. These driving signals S7X and S7Y have many pulses whose numbers correspond to values of $\Delta x/k$ and $\Delta y/k$ conforming respectively to the required moving distances for the holder 131 toward the X and Y directions. The pulse motors 122 and 125 rotate corresponding to numbers of pulses of the driving signals S7X and S7Y, respectively, and the position of the holder 131 is settled.

The actual position of the holder 131 is detected by the differential transformers 138 and 139, and signals S8X and S8Y generated from the differential transformers 138 and 139 due to the detection of the actual position of the holder 131 are transmitted to the pattern position control circuit 121 and utilized for a closed loop control of the position of the holder 131. When establishment of the holder position is completed, an output signal S6 is generated from the pattern position control circuit 121.

An exposure control circuit 5 generates a driving signal S3 in response to the signal S6, and transmits the signal S6 to driving means 63 for driving a shutter 62. The driving means 63 controls the opening or closing of the shutter 62 in response to the signal S3.

A mercury lamp is utilized as a light source 61 and always emits light. Therefore, when the shutter 62 is opened, light from the light source 61 irradiates an original pattern formed on a back-surface of the mak 1 through a condenser lens 7, whereby a reduced pattern of the original pattern by a reduction lens 8 is projected on the surface of the workpiece 2. In this case, the original pattern is precisely projected on the workpiece 2 at a desired position, since the positioning errors $\Delta x$ and $\Delta y$ of the workpiece 2 are just cancelled by the movements of the mask 1 by $-\Delta x/k$ and $-y/k$, and hence the alignment error between the mask 1 and the workpiece 2 becomes remarkably small.

In the embodiment shown in FIG. 4, since an ordinary XY fine adjusting mechanism is used for positioning the table 4 and closed loop control system is not employed for positioning the table 4, the positioning speed becomes remarkably high though the positioning precision is slightly lowered.

For example, when the table 4 is moved by 5 $\mu$m per pulse in the pulse motor driving signal and a pulse train of 5000 pps is utilized as the driving signal, the positioning speed becomes very high and is 25 mm/sec although the positioning precision is lowered and is ± 5 $\mu$m. On the other hand, in the conventional positioning apparatus wherein the closed loop control system is utilized, the positioning speed is about 0.5-5 mm/sec, and the positioning precision is ±0.1-0.25 $\mu$m.

Thus, according to the present invention, it becomes possible to establish the position at a high speed, since the positioning error of the table 4 is cancelled by the movement of the mask 1 and hence the positioning precision of the table 4 need not be high.

Further, it is easy to obtain a positioning precision of about ± 0.5 $\mu$m for a moving range of the holder of about ± 100 $\mu$m, since the fine adjusting mechanism utilizing two pairs of parallel leaf springs therein is utilized for positioning the holder 131, and since the closed loop control system wherein the differential transformers are utilized as means for detecting the holder position is employed. Under this precision, the positioning speed can be maintained sufficiently high.

Furthermore, the position of the table 4 is detected with an accuracy of ± 0.1 $\mu$m, since a laser interferometer is utilized for detecting the position of the table 4.

Now, assuming that the reduction rate $k$ of the lens 8 is 1/10 and that the positioning error $\Delta x$ of the table 4 is $-2$ $\mu$m, the required moving distance $-\Delta x/k$ for the mask becomes $+20$ $\mu$m. The required time period for establishing the position is several ten m.sec. Though the positioning error of the mask 1 is ±0.5 $\mu$m, this error is reduced to 1/10 by the reduction lens 8 on the workpiece, and hence causes an alignment error of only ± 0.05 $\mu$m on the workpiece 2. Therefore, the positioning error of the mask 1 can practically be ignored. That is, in the embodiment described above, the final alignment error $\delta$, i.e. the difference between the desired exposure position and the actual exposure position is equal to the statistical sum total of the measuring error of ±0.1 $\mu$m of the table position by the laser interferometer and the alignment error of ± 0.05 $\mu$m due to the positioning error of the mask 1. That is, $\delta = \pm \sqrt{0.1^2 + 0.05^2}$ $\mu$m $\simeq \pm$ 0.112 $\mu$m.

As has been apparent from the above description, the final alignment error depends almost on the measuring error of the table position by the laser interferometer, and hence, when the measuring accuracy of the table position is higher, an exposure apparatus whose alignment accuracy is higher can be provided.

As described above, the alignment accuracy in the optical exposure apparatus of this embodiment is never lower when compared with the alignment accuracy in the conventional apparatus utilizing the closed loop control system for settling the position. Therefore, the present invention is of advantage in the high speed operation for the alignment.

When, in the embodiment described above, a wafer for an integrated circuit on which a photo-resist is coated is disposed on the table 4 as the workpiece 2, chips for the integrated circuit can directly be exposed one by one with a high precision and in a high speed.

The direct exposure method utilizing therein the reduction lens has such advantages, when compared with the conventional exposure method wherein a wafer on which the photomask is contacted is utilized, that (1) more fine patterns can be exposed and (2) no damages of the photomask and the wafer are caused, since the wafer and the photomask do not contact each other. But the conventional direct exposure method utilizing therein the reduction lens is not practically utilized in a step for a mass production, since, in this conventional method, a long time period is required for establishing the wafer position. This disadvantage is successfully eliminated by the present invention.

In this case, since a new pattern should be exposed in a state of precisely overlapping the new pattern with the circuit pattern previously exposed and processed, it is necessary that the apparatus of the present invention further comprises means for precisely aligning the wafer to an original point of the apparatus by detecting a position of a target previously formed on the wafer, and means for resetting the laser interferometer when the alignment of the wafer is completed and making the position of the table 4 at this time an original point for the next step.

Figure 1:
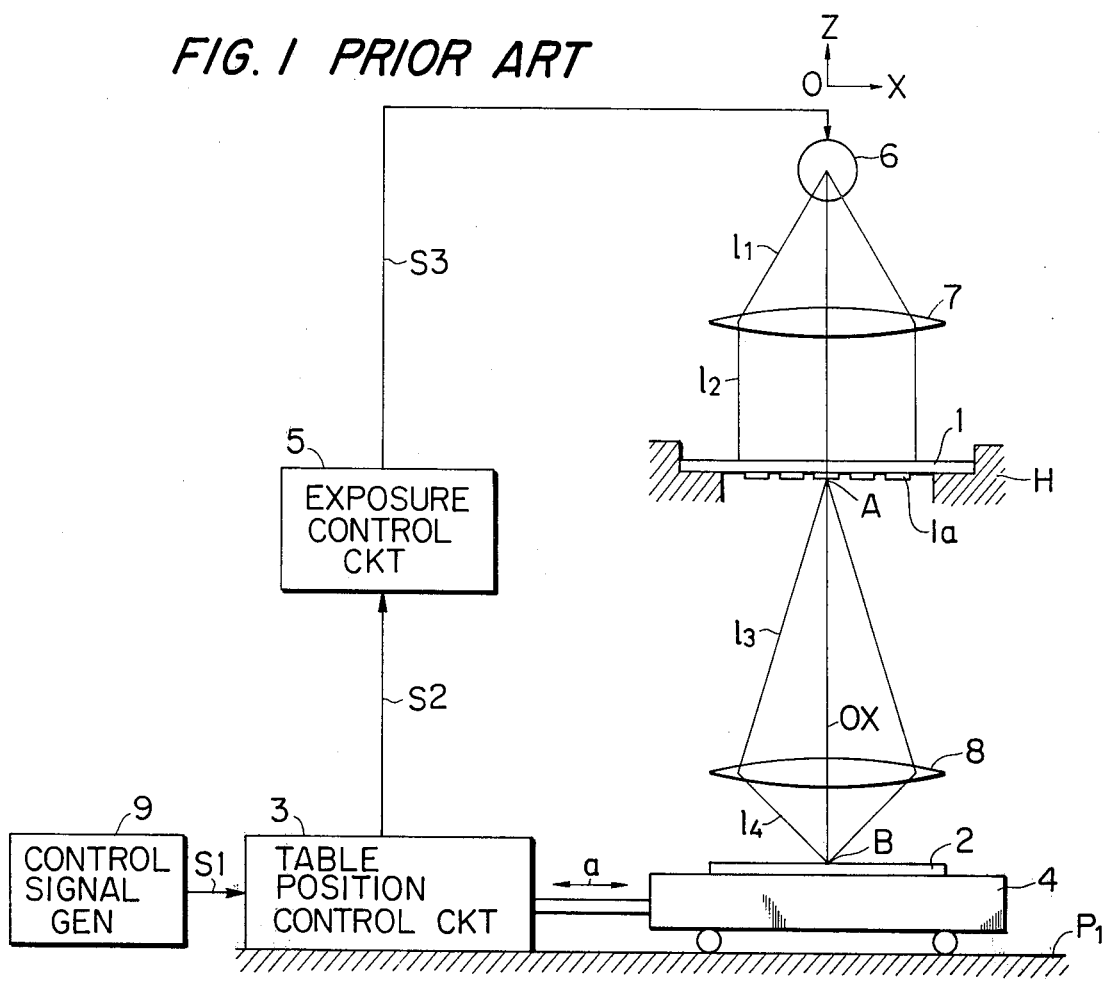
FIG. 1 is a schematic diagram of a conventional optical exposure apparatus.

As has been described above, according to the present invention, the following advantages are accomplished. (1) The alignment at high precision is done without utilizing a moving workpiece table having a high positioning accuracy, since the positioning error of the workpiece is compensated by moving the mask. The movable mask holder which is one of features of the present invention can easily be constructed by utilizing a simple parallel spring guiding mechanism and a simple screw feeding mechanism, since the required moving distance is so short and the required positioning accuracy is not so high.; (2) The moving speed of the workpiece can be made high, since the high accuracy is not required for establishing the position of the workpiece. The positioning speed of the movable mask holder can also be made high, when compared with that in the conventional apparatus, since the movable parts, such as the moving table, can be made light in weight in addition to that the required moving distance is short and the requirement for positioning accuracy is not so severe. In the conventional apparatus shown in FIG. 1, several seconds are required for positioning. On the other hand, in the present invention, the mask position can be settled within several tens of milli-seconds. Therefore, even when this time period is added to the time period required for positioning of the workpiece, the time period required for establishing the position in the present invention is very short when compared with that required for the conventional apparatus. (3) The shortening of the time period for the positioning leads to the shortening of the time period required for the work for the whole workpiece, and hence, not only the efficiency required for the whole workpiece is increased, but also there is a lowering of the alignment accuracy due to the change of the environment conditions, such as the change of the temperature around the apparatus during the working.

While the present invention has been shown and described in terms of the best mode contemplated for carrying out the invention, it will be appreciated that changes and modifications can be made which do not depart from the inventive concepts taught herein. Such changes and modifications are deemed to be within the purview of the present invention.

What is claimed is:

1. An optical exposure apparatus for exposing a workpiece to a reduced light pattern obtained from an original pattern through a projective lens having a reduction ratio smaller than one, comprising:
   first means for generating a first control signal and for positioning the workpiece at a predetermined position in accordance with said first control signal;
   second means for detecting an error in the actual positioning of the workpiece relative to the position represented by the first control signal generated by said first means and generating an error signal representative of said error; and
   third means, responsive to the error signal generated by said second means, representative of the error of positioning of the workpiece, for generating a second control signal and for automatically shifting the original pattern in accordance with said second control signal, so as to cancel the error.

2. An optical exposure apparatus defined in claim 1, wherein said first means comprises a moving table supporting the workpiece, and means for controlling the table position so as to position the workpiece at the predetermined position.

3. An optical exposure apparatus defined in claim 1, wherein said third means comprises a movable holder supporting a mask forming the original pattern, and means for controlling the holder position in response to said second control signal so as to cancel the error.

4. An optical exposure apparatus defined in claim 1, wherein said third means comprises means for calculating a value of the error of positioning the workpiece divided by the reduction ratio of the projective lens, and means for shifting the original pattern by the calculated value so as to cancel the error.

5. An optical exposure apparatus comprising:
   a moving table for supporting a workpiece to be exposed;
   a movable holder for supporting a mask having an original pattern;
   means for irradiating the mask with parallel light;
   a reduction lens for projecting a reduced pattern of said original pattern onto said workpiece;
   means for controlling the table position so as to position the workpiece at a predetermined position;
   means for detecting an error of positioning the workpiece;
   means for calculating a value of the error of positioning the workpiece divided by the reduction ratio of the reduction lens; and
   means for shifting the movable holder by the calculated value so as to move the mask having the original pattern and thereby cancel the error of positioning the workpiece.

* * * * *